(12) United States Patent  
Chung et al.

(10) Patent No.: US 8,451,655 B2  
(45) Date of Patent: May 28, 2013

(54) MRAM CELLS AND CIRCUIT FOR PROGRAMMING THE SAME

(75) Inventors: Shine Chung, San Jose, CA (US);
 Hung-Sen Wang, Tainan (TW);
 Tao-Wen Chung, Zhubei (TW);
 Chun-Jung Lin, Hsin-Chu (TW);
 Yu-Jen Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/364,955

(22) Filed: Feb. 2, 2012

(65) Prior Publication Data

US 2012/0127788 A1    May 24, 2012

Related U.S. Application Data

(63) Continuation of application No. 12/617,982, filed on Nov. 13, 2009, now Pat. No. 8,111,544.

(60) Provisional application No. 61/154,660, filed on Feb. 23, 2009.

(51) Int. Cl.
  *G11C 11/00*    (2006.01)
(52) U.S. Cl.
  USPC ............... 365/158; 365/185.14; 365/189.011; 365/189.14; 365/189.15; 365/185.22

(58) Field of Classification Search
  USPC ............... 365/158, 189.011, 189.14, 189.15, 365/189.16, 185.11, 185.14
  See application file for complete search history.

(56) References Cited

U.S. PATENT DOCUMENTS

| 7,239,568 B2 | 7/2007 | Perner et al. |
| 7,936,592 B2 | 5/2011 | Wang et al. |
| 2006/0209585 A1* | 9/2006 | Tanizaki et al. ............... 365/148 |
| 2006/0209593 A1* | 9/2006 | Toda ........................ 365/185.03 |

FOREIGN PATENT DOCUMENTS

| CN | 1649029 A | 8/2005 |
| CN | 101071632 A | 11/2007 |

* cited by examiner

*Primary Examiner* — Thong Q Le  
(74) *Attorney, Agent, or Firm* — Slater & Matsil, L.L.P.

(57) ABSTRACT

A circuit includes magneto-resistive random access memory (MRAM) cell and a control circuit. The control circuit is electrically coupled to the MRAM cell, and includes a current source configured to provide a first writing pulse to write a value into the MRAM cell, and a read circuit configured to measure a status of the MRAM cell. The control circuit is further configured to verify whether a successful writing is achieved through the first writing pulse.

19 Claims, 3 Drawing Sheets

MRAM CELLS AND CIRCUIT FOR PROGRAMMING THE SAME

This application is a continuation of U.S. patent application Ser. No. 12/617,982, filed on Nov. 13, 2009, and entitled "Programming MRAM Cells Using Probability Write," which application further claims the benefit of U.S. Provisional Application No. 61/154,660, filed on Feb. 23, 2009, and entitled "Programming MRAM Cells Using Probability Write," which applications are hereby incorporated herein by reference.

TECHNICAL FIELD

The present invention relates generally to memory devices, and more particularly to the writing (programming) of magneto-resistive random access memory (MRAM) devices.

BACKGROUND

Semiconductors are used in integrated circuits for electronic applications, including radios, televisions, cell phones, and personal computing devices. One type of semiconductor device is a semiconductor storage device, such as dynamic random access memories (DRAMs), or flash memories, both of which use charges to store information.

A more recent development in semiconductor memory devices involves spin electronics, which combines semiconductor technology and magnetic materials and devices. The spin polarization of electrons, rather than the charge of the electrons, is used to indicate the state of "1" or "0." One such spin electronic device is a spin torque transfer (STT) magnetic tunneling junction (MTJ) device 10, as shown in FIG. 1.

MTJ device 10 includes free layer 12, tunnel layer 14, and pinned layer 16. The magnetization direction of free layer 12 can be reversed by applying a current through tunnel layer 14, which causes the injected polarized electrons within free layer 12 to exert so-called spin torques on the magnetization of free layer 12. Pinned layer 16 has a fixed magnetization direction. When current I1 flows in the direction from free layer 12 to pinned layer 16, electrons flow in a reverse direction, that is, from pinned layer 16 to free layer 12. The electrons are polarized to the same magnetization direction of pinned layer 16 after passing pinned layer 16, flowing through tunnel layer 14, and then flowing into and accumulating in free layer 12. Eventually, the magnetization of free layer 12 is parallel to that of pinned layer 16, and MTJ device 10 will be at a low resistance state. The electron injection caused by current I1 is referred to as a major injection.

When current I2 flowing from pinned layer 16 to free layer 12 is applied, electrons flow in the direction from free layer 12 to pinned layer 16. The electrons having the same polarization as the magnetization direction of pinned layer 16 are able to flow through tunnel layer 14, and into pinned layer 16. Conversely, electrons with polarization differing from the magnetization of pinned layer 16 will be reflected (blocked) by pinned layer 16, and will accumulate in free layer 12. Eventually, magnetization of free layer 12 becomes anti-parallel to that of pinned layer 16, and MTJ device 10 will be at a high-resistance state. The respective electron injection caused by current I2 is referred to as a minor injection.

To eliminate the parasitic loading of MRAM cells, when MRAM cells are integrated in MRAM arrays, selectors are used to electrically isolate the unselected MRAM cells from source lines. For example, FIG. 2 illustrates an MRAM cell including MTJ device 10 and selector 20, which is controlled by word line 22 and connected between bit-line BL and source line SL. When MTJ device 10 is selected for writing or reading, word line 22 is set to logic high, so that writing current I can pass MTJ device 10. The addition of selector 20, however, causes an increase in the chip area per MRAM cell. To reduce the chip area usage of selector 20, selector 20 is typically small. However, this means that writing current I is limited.

The writing of MRAM cells is related to quantum mechanisms, and the probability of a successful writing is related to two factors, writing current I and the pulse width of writing current I. The greater writing current I is and/or the longer the writing pulse is, the greater the possibility of a successful writing. Since selector 20 as shown in FIG. 2 limits writing current I, the pulse width has to be increased. However, with factors such as writing current variation, quantum mechanism, and the possibility of sudden power variation, even if the pulse width is increased, uncertainty still exists in the writing of MRAM cells. As a result, most of the MRAM cells can be written in relatively short writing pulses, while a small amount of MRAM cells require much longer writing time than others. To ensure no failure occurs in the writing, the pulse width has to be so great as to ensure that even the MRAM cell requiring the longest pulse can be successfully written. This means that the pulse width will be significantly greater than the required pulse widths of most of the MRAM cells. The writing time is thus significantly extended. Methods for solving the above-discussed problems are thus needed.

SUMMARY OF THE INVENTION

In accordance with one aspect of the embodiments, a circuit includes magneto-resistive random access memory (MRAM) cell and a control circuit. The control circuit is electrically coupled to the MRAM cell, and includes a current source configured to provide a first writing pulse to write a value into the MRAM cell, and a read circuit configured to measure a status of the MRAM cell. The control circuit is further configured to verify whether a successful writing is achieved through the first writing pulse.

In accordance with another aspect of the embodiments, a circuit includes an MRAM cell, and a control circuit electrically coupled to the MRAM cell. The control circuit includes a current source and a read circuit. The current source is configured to provide a plurality of writing pulses to write a same value to the MRAM cell, wherein an intended one-write-probability of each of the plurality of writing pulses is less than 100 percent. The read circuit is configured to read a status of the MRAM cell, wherein the control circuit is configured to control the read circuit to read the status of the MRAM cell after each of the plurality of writing pulses is provided to the MRAM cell.

In accordance with yet another aspect of the embodiments, a circuit includes an MRAM cell, and a control circuit electrically coupled to the MRAM cell. The control circuit is configured to provide a plurality of write-verification cycles. Each of the plurality of write-verification cycles includes a writing step and a verification step, wherein an intended one-write-probability of the writing step in each of the plurality of write-verification cycles is less than 100 percent.

The advantageous features of the present invention include reduced writing time for writing MRAM cells without requiring an increase in the sizes of the selectors of the MRAM cells.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the present invention are discussed in detail below. It should be appreciated, however, that the embodiments provide many applicable inventive concepts that can be embodied in a wide variety of specific contexts. The specific embodiments discussed are merely illustrative of specific ways to make and use the invention, and do not limit the scope of the invention.

A novel method for writing magneto-resistive random access memory (MRAM) cells is presented. The variations and the operation of the embodiment are then discussed. Throughout the various views and illustrative embodiments of the present invention, like reference numbers are used to designate like elements.

Figure 1:
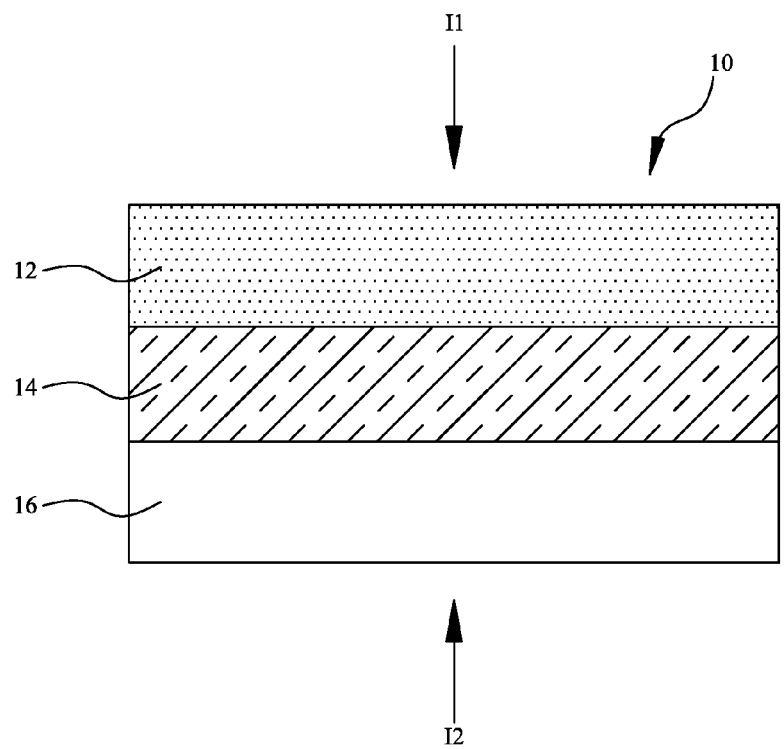
FIG. 1 illustrates a cross-sectional view of a magnetic tunneling junction (MTJ) device.
Figure 2:
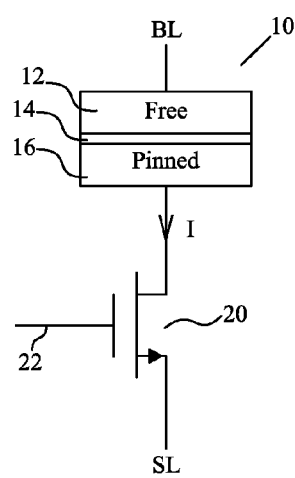
FIG. 2 illustrates an MRAM cell including an MTJ device controlled by a selector.
Figure 3:
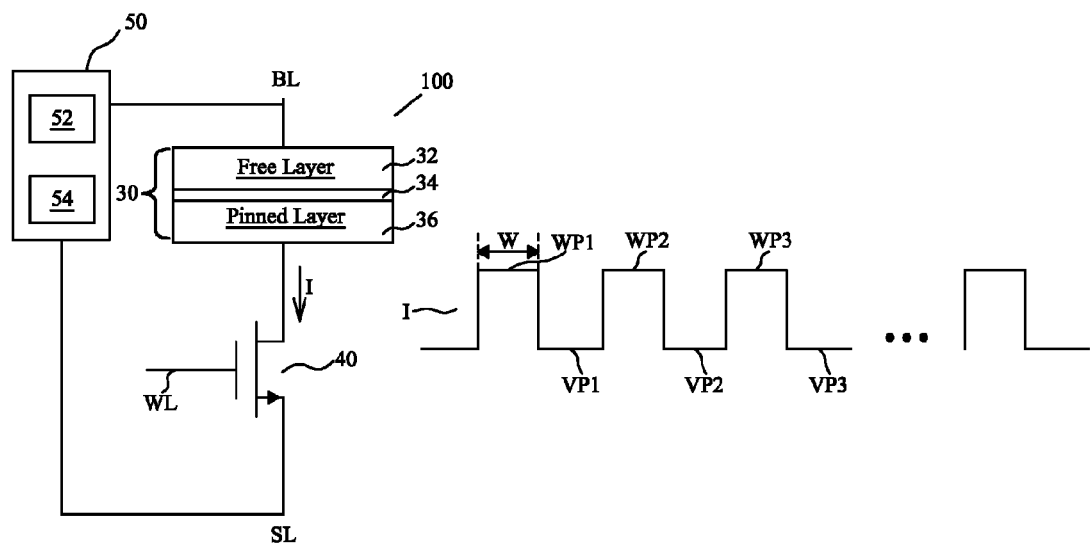
FIG. 3 illustrates a schematic waveform of writing pulses for writing an MRAM cell and a circuit for providing the writing pulses.

FIG. 3 illustrates MRAM cell 100, which includes magnetic tunneling junction (MTJ) device 30 and selector 40. MTJ device 30 includes free layer 32, tunnel layer 34, and pinned layer 36. The magnetization direction of pinned layer 36 is fixed, while the magnetization direction of free layer 32 can be changed by applying writing current I. Writing current I may either be in the direction as shown in FIG. 3, or in a reversed direction. By applying writing current I in different directions, MTJ device 30 may be programmed to different states. It is realized that MTJ device 30 may include more layers with different combinations, which combinations are also in the scope of the embodiments of the present invention.

MTJ device 30 is controlled by selector 40, which may be a metal-oxide-semiconductor (MOS) transistor. The gate of selector 40 may be connected to word-line WL. Selector 40, when turned off, may isolate MTJ device 30 from source line SL. When writing or reading operations are performed to MTJ device 30, selector 40 is turned on so that the writing or reading currents can flow through MTJ device 30. MRAM cell 100 is also connected to bit-line BL. Although FIG. 3 illustrates that the side of free layer 32 is connected to bit-line BL, while the side of pinned layer 36 is connected to selector 40, the connection may be reversed.

FIG. 3 also illustrates an exemplary waveform of writing current I for writing (programming) MTJ device 30. Writing current I includes one or more writing pulses WP (denoted as WP1, WP2, WP3, and the like), during which the magnitude of writing current I is greater than a critical current required for writing MTJ device 30. If current I is smaller than the critical current, MTJ device 30 cannot be successfully written regardless of the width W of writing pulse WP. It is noted that the magnitude of writing current I is related to the capability and the size of selector 40, and the larger the selector 40 is, the greater writing current I can be.

The pulse width W of writing pulse WP is so designed that the probability (referred to as one-write-probability hereinafter) of the successful writing by one writing pulse WP is less than 100 percent, which means that the writing has an intended probability (as designed) of failure. This is different from conventional writing schemes, wherein even if there may be writing failures, the intended one-write-probability is 100 percent. On the other hand, it is desirable for the probability of the successful writing to be greater than 50 percent. In other words, most of the MRAM cells in an MRAM array will be successfully written after one writing pulse.

After the first writing pulse WP (denoted as WP1), a verification is performed to verify whether the previous writing was successful or not. In FIG. 3, the verification periods are denoted as VP (indicated as VP1, VP2, VP3, and the like), during which no writing current I is provided to MTJ device 30. Instead, a small current smaller than the critical current may be used to determine the state of MTJ device 30 by measuring, for example, the resistance of MTJ device 30. Verification period VP1 may be immediately after the first writing pulse WP1. In an embodiment, the term "immediately" means that no writing to other MRAM cells (not shown, but may have an identical structure as MRAM cell 100 in FIG. 3) in the same MRAM array is performed between writing pulse WP1 and verification period VP1. The term "immediately" may also mean that verification period VP1 is performed a very short time after writing pulse WP1 is finished, for example, within 100 nanoseconds, or even within 50 nanoseconds.

If the verification performed during verification period VP1 indicates that the writing performed by writing pulse WP1 is successful, the writing to MTJ device 30 is finished, and the additional writing pulses denoted as WP2, WP3 and the like will not be performed. If, however, the writing is not successful, writing pulse WP2 is applied to rewrite MTJ device 30 with the same value attempted by writing pulse WP1. In an embodiment, as shown in FIG. 3, writing pulse WP2 is substantially identical to writing pulse WP1, for example, with the substantially same pulse width W and same current magnitude. Since the writing is probability related, the probability of successful writing to MTJ device 30 by writing pulses WP1 and WP2 is greater than the one-write-probability of writing pulse WP1 alone. In an embodiment, writing pulse WP2 is provided immediately after verification period VP1 of MTJ device 30 is finished, for example, within 100 nanoseconds, or even within 50 nanoseconds. After writing pulse WP2, another verification VP2 is performed. Again, if the writing performed by writing pulse WP2 is successful, the writing is finished, and the additional writing pulses such as writing pulse WP3 will not be performed. If, however, the writing is not successful, writing pulse WP3 is applied to rewrite MRAM cell 100 with the same value attempted by writing pulses WP1 and WP2.

In the above-discussed embodiment, each writing pulse WP is followed by a verification period VP, and the combination of the writing pulse WP and the subsequent verification VP is referred to as a write-verification cycle. The corresponding writing scheme including the write-verify cycles is referred to a probability writing scheme. It is realized that each additional writing pulse WP results in an increase in the probability of a successful writing. The write-verification cycles will continue until, eventually, MTJ device 30 is successfully written. In an embodiment, if MTJ device 30 cannot be written after a pre-determined number of write-verification cycles, the writing effort will be halted, and the respective MRAM cell 100 is marked as defected.

The one-write-probability is preferably great enough so that most of the MRAM cells in a memory array can be successfully written after the first writing pulse WP1. On the other hand, the one-write-probability is preferably less than 100 percent. Otherwise, the pulse length W of writing pulse WP1 has been set unnecessarily long, and the advantageous feature of the embodiments of the present invention cannot be realized. In an embodiment, the one-write-probability may be greater than about 99 percent and less than 100 percent. In other embodiments, the one-write-probability may be less than about 99 percent. In yet other embodiments, the one-write-probability may be less than about 90 percent. In yet other embodiments, the one-write-probability may also be less than about 70 percent. The appropriate combination of the magnitude of writing current I and pulse width W for achieving the above-discussed one-write-probability may be found through experiments.

Due to the probability writing, in an MRAM array, there may be a first MRAM cell (shown as MRAM cell 100 as in FIG. 3) that may be successfully written in the first write-verification cycle. On the other hand, there may be a second MRAM cell (also shown as MRAM cell 100 as in FIG. 3) that may need a second, a third, or even more write-verification cycles before it can be successfully written.

By reducing the one-write-probability to a value less than 100 percent, pulse width W can be significantly reduced compared to conventional pulse widths required to achieve 100 percent one-write-probability. The overall writing time is thus significantly reduced. Although there may be a small percentage of memory cells that require additional writing pulses, the overall writing time is still significantly reduced.

Figure 4:
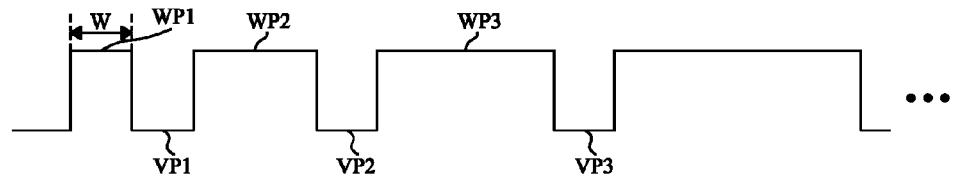
FIGS. 4 and 5 are schematic waveforms of writing pulses for writing an MRAM cell.
Figure 5:
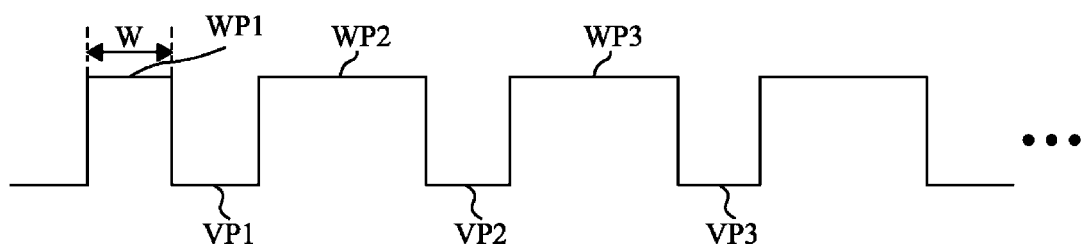

In the embodiment illustrated in FIG. 3, all writing pulses WP are identical, or substantially identical, to each other, for example, with the current magnitudes and/or pulse lengths W having less than about 10 percent variation. In alternative embodiments, writing pulses WP are different from each other. For example, in an embodiment as shown in FIG. 4, each of the additional writing pulses may have a pulse length greater than the previous writing pulse until, at a certain time, it is determined that MRAM cell 100 is defective, and the writing is halted. In alternative embodiments as shown in FIG. 5, the first writing pulse WP1 is the shortest, while the subsequent writing pulses are longer, and may be identical to each other or different from each other. One skilled in the art will realize that there are many more combinations as to the lengths of writing pulses WP, and these combinations are also in the scope of the embodiments of the present invention.

Referring back to FIG. 3, an exemplary control circuit 50 is illustrated. Control circuit 50 is configured to provide writing current I as discussed in the preceding paragraphs, and to verify the status of MTJ device 30 (whether it has been successfully written or not). In an embodiment, control circuit 50 includes current source 52 for providing writing current I, and read circuit 54 for measuring the state of MTJ device 30. Current source 52 and read circuit 54 are synchronized with each other to generate the write-verification cycles.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. A circuit comprising:
  a magneto-resistive random access memory (MRAM) cell; and
  a control circuit electrically coupled to the MRAM cell, wherein the control circuit comprises:
    a current source configured to provide a first writing pulse to write a value into the MRAM cell; and
    a read circuit configured to measure a status of the MRAM cell, wherein the control circuit is further configured to verify whether a successful writing is achieved through the first writing pulse, wherein the control circuit is further configured to:
    when the status of the MRAM cell indicates a successful writing by the first writing pulse, stop writing the value to the MRAM cell; and
    when the status of the MRAM cell indicates an unsuccessful writing by the first writing pulse, provide a second writing pulse to write the value to the MRAM cell, wherein the second writing pulse is different from the first writing pulse.

2. The circuit of claim 1, wherein the control circuit is further configured to:
  verify an additional status of the MRAM cell by the second writing pulse;
  when the additional status of the MRAM cell indicates a successful writing by the second writing pulse, stop writing the value to the MRAM cell; and
  when the additional status of the MRAM cell indicates an unsuccessful writing by the second writing pulse, provide a third writing pulse to write the value to the MRAM cell.

3. The circuit of claim 1, wherein the current source is configured to control the second writing pulse to be substantially identical to the first writing pulse.

4. The circuit of claim 1, wherein the current source is configured to control the second writing pulse to have a pulse width different from a pulse width of the first writing pulse.

5. The circuit of claim 1, wherein an intended one-write-probability of the first writing pulse is less than 100 percent.

6. The circuit of claim 5, wherein the intended one-write-probability of the first writing pulse is less than about 99 percent.

7. The circuit of claim 6, wherein the intended one-write-probability of the first writing pulse is less than about 70 percent.

8. The circuit of claim 1, wherein the control circuit is configured to verify the status of the MRAM cell within about 50 nanoseconds after the current source provides the first writing pulse to the MRAM cell.

9. A circuit comprising:
  a magneto-resistive random access memory (MRAM) cell; and
  a control circuit electrically coupled to the MRAM cell, wherein the control circuit comprises:

a current source configured to provide a plurality of writing pulses to write a same value to the MRAM cell, wherein an intended one-write-probability of each of the plurality of writing pulses is less than 100 percent; and a read circuit configured to read a status of the MRAM cell, wherein the control circuit is configured to control the read circuit to read the status of the MRAM cell after each of the plurality of writing pulses is provided to the MRAM cell.

10. The circuit of claim 9, wherein the control circuit is further configured to stop writing to the MRAM cell when a pre-determined number of writing pulses is provided to the MRAM cell, and when the read circuit indicates that the same value is not successfully written into the MRAM cell.

11. The circuit of claim 9, wherein the control circuit is further configured to control the current source to increase a pulse length of a subsequent one of the plurality of writing pulses when the read circuit verifies that the MRAM cell fails to be written into in a preceding one of the plurality of writing pulses.

12. The circuit of claim 9, wherein the control circuit is further configured to control the current source to increase a pulse magnitude of a subsequent one of the plurality of writing pulses when the read circuit verifies that the MRAM cell fails to be written into in a preceding one of the plurality of writing pulses.

13. The circuit of claim 9, wherein the current source is configured to control the plurality of writing pulses to be identical to each other.

14. The circuit of claim 9, wherein the control circuit, the current source, and the read circuit are controlled not to write into and read from any additional MRAM cell in a same MRAM array before the plurality of writing pulses is finished.

15. The circuit of claim 9, wherein the intended one-write-probability of each of the plurality of writing pulse is less than about 90 percent.

16. A circuit comprising:

a magneto-resistive random access memory (MRAM) cell; and a control circuit electrically coupled to the MRAM cell, wherein the control circuit is configured to provide a plurality of write-verification cycles, wherein each of the plurality of write-verification cycles comprises a writing step and a verification step, and wherein an intended one-write-probability of the writing step in each of the plurality of write-verification cycles is less than 100 percent.

17. The circuit of claim 16, wherein the control circuit is configured to stop writing to the MRAM cell when a verification result of a verification step indicates a previous writing step results in a successful writing into the MRAM cell.

18. The circuit of claim 16, wherein the control circuit is configured to stop writing to the MRAM cell when all of the plurality of write-verification cycles fails to result in a successful writing into the MRAM cell.

19. The circuit of claim 16, wherein a pulse length of each of a subsequent one of the plurality of write-verification cycles is greater than a pulse length of a preceding one of the plurality of write-verification cycles.

* * * * *